(12) United States Patent
Lee et al.

(10) Patent No.: US 12,334,163 B2
(45) Date of Patent: Jun. 17, 2025

(54) SINGLE-LEVEL CELL PROGRAM-VERIFY, LATCH-LIMITED DATA RECOVERY

(71) Applicant: Micron Technology, Inc., Boise, ID (US)

(72) Inventors: Eric N. Lee, San Jose, CA (US); Tomoko Ogura Iwasaki, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 179 days.

(21) Appl. No.: 18/128,463

(22) Filed: Mar. 30, 2023

(65) Prior Publication Data

US 2023/0352107 A1 Nov. 2, 2023

Related U.S. Application Data

(60) Provisional application No. 63/326,071, filed on Mar. 31, 2022.

(51) Int. Cl.
*G11C 16/34* (2006.01)
*G11C 16/10* (2006.01)
*G11C 29/52* (2006.01)

(52) U.S. Cl.
CPC ........ *G11C 16/3459* (2013.01); *G11C 16/102* (2013.01); *G11C 29/52* (2013.01)

(58) Field of Classification Search
CPC .... G11C 16/3459; G11C 16/102; G11C 29/52
See application file for complete search history.

(56) References Cited

U.S. PATENT DOCUMENTS 8,923,056 B2 * 12/2014 Kim ............... G11C 16/3459
365/185.11
2011/0271041 A1 * 11/2011 Lee .................... G06F 12/0246
711/E12.008

* cited by examiner

*Primary Examiner* — Vanthu T Nguyen
(74) *Attorney, Agent, or Firm* — Lowenstein Sandler LLP

(57) ABSTRACT

Control logic in a memory device identifies memory cells of a memory array configured as single-level cell (SLC) memory, where the memory cells include two or more memory cells programmed during a program phase and associated with a selected wordline of the memory array. The control logic further causes a program verify voltage to be applied to the selected wordline during a ganged SLC verify operation to be performed concurrently on the memory cells. In response to the memory cells failing to pass ganged SLC verify operation, the control logic further: copies first data, which is associated with a first memory cell, into the data recovery latch; causes a program verify operation to be performed separately on the first memory cell; and in response to the first memory cell reaching a program verify voltage, causes an inhibit of the first memory cell from further programming.

20 Claims, 9 Drawing Sheets

SINGLE-LEVEL CELL PROGRAM-VERIFY, LATCH-LIMITED DATA RECOVERY

REFERENCE TO RELATED APPLICATION

This application claims the benefit of U.S. Provisional Patent Application No. 63/326,071, filed Mar. 31, 2022, the entirety of which is incorporated herein by reference.

TECHNICAL FIELD

Embodiments of the disclosure relate generally to memory sub-systems, and more specifically, relate to a single-level cell (SLC) program-verify, latch-limited data recovery.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
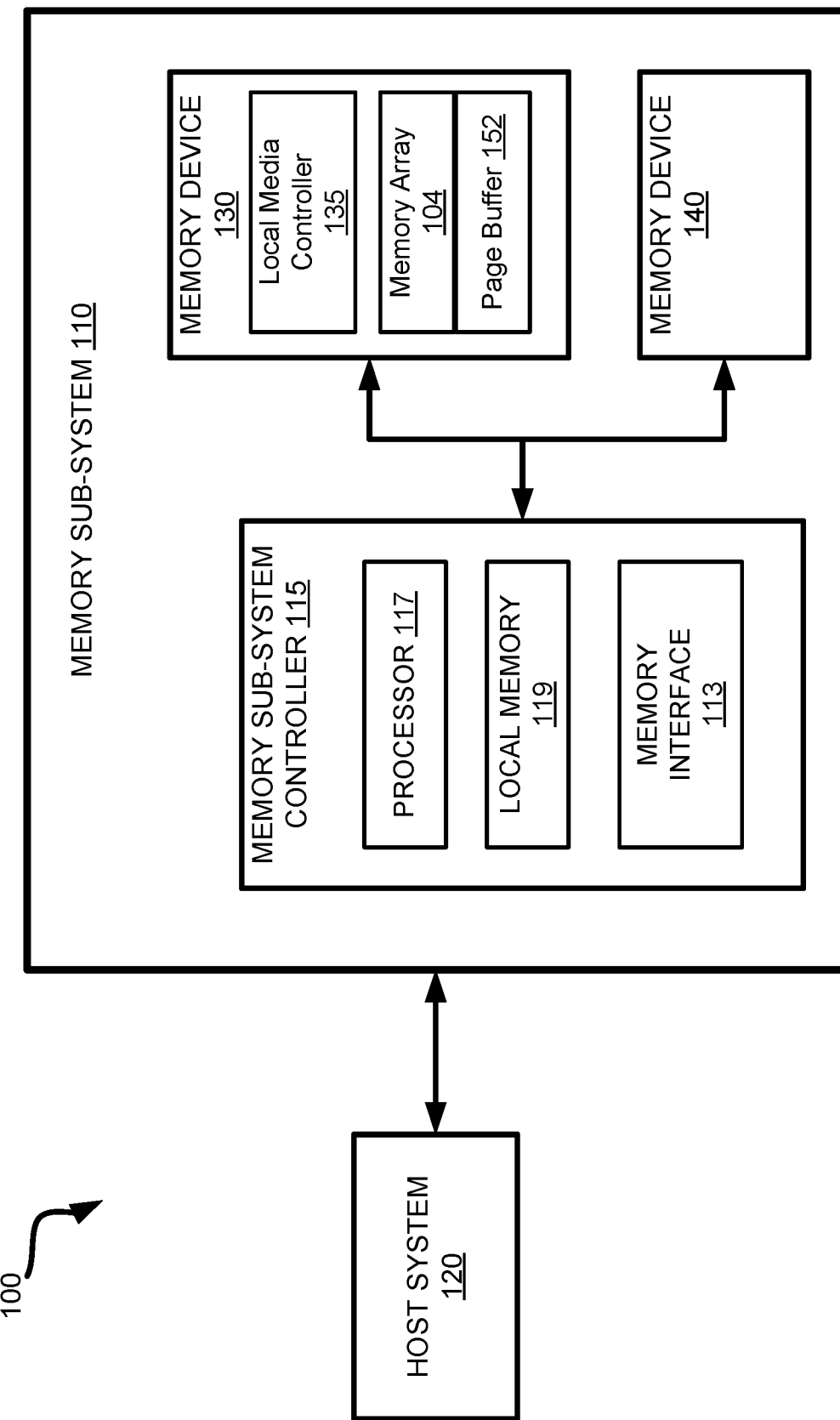
FIG. 1A illustrates an example computing system that includes a memory sub-system in accordance with some embodiments of the present disclosure.

Aspects of the present disclosure are directed to single-level cell (SLC) program-verify, latch-limited data recovery in a memory device of a memory sub-system. During a program operation on a non-volatile memory device, certain phases can be employed, including program and program verify phases. To increase performance of SLC programming of the memory device, a single program pulse is applied to a selected wordline of a block of memory cells during a program phase of a page of data. Performance is further maximized by applying, during a program verify phase, a single program verify pulse to the selected wordline to verify the voltage of the memory cells to which are being programmed the page of data. Assuming the program verify passes, the memory cells that have been programmed are inhibited so that further programming of the block does not increase the voltage in the memory cells that have already reached a program verify voltage.

In certain memory devices, the inhibit operation causes data stored in the memory cells to be removed from a page buffer that is used to perform the program and program verify phases at the block of memory cells. The data is removed because, while a source latch in the page buffer stores the page of data during programming, this data is replaced with the inhibit voltage level so as to conserve the number of latches required in the page buffer. Thus, the backup of the page of data is lost. If programming the block fails, the page of data is no longer recoverable at least from the page buffer. If this data is not backed up somewhere else, the page of data is lost.

Further, in these memory devices, multi-page SLC programming as well as cache programming require even more latches to support data recovery. For example, if two pages of data are programmed concurrently to the block of memory cells, double the number of latches are required to store that data and provide inhibit capability, among other needs for latches associated with the page buffer. Multiplying the number of latches in the page buffer is cost ineffective, despite the fact that multi-page SLC programming can increase overall programming performance, e.g., by programming at least twice as much data during the same program phase. For ease of explanation, this disclosure assumes a page of data corresponds to data stored in a memory cell.

Aspects of the present disclosure address the above and other deficiencies by implementing multi-cell programming and a ganged SLC verify operation, which does not employ inhibiting programmed memory cells, followed by selective serial performance of single program verify operations of individual memory cells in response to a failure of the ganged SLC verify operation of a set of memory cells within an array of memory cells. The set of memory cells, for example, can include two or more memory cells. The ganged SLC verify operation is a verification operation that can be performed concurrently on the set of memory cells, e.g., in a single verify operation, thereby improving performance. In this way, the performance-enhancing aspects of multi-cell programming and ganged SLC verification are combined with, when necessary, individual program verify operations that ensure data is recoverable while completing the multi-cell programming, all without use of additional latches, as will be explained in more detail.

More specifically, if, after a single loop of a multi-cell programming and ganged SLC verify operation of the set of memory cells, the ganged SLC verify operation results in failure to detect the program verify voltage in each of the multiple memory cells, the programming operation can transition to serially perform a single program verify operation on each memory cell of the set of memory cells in turn. In doing so, before each single program verify operation for an individual memory cell, the data to be stored in the individual memory cell is copied into a single data recovery latch. This temporary buffering of the data makes the data recoverable, even if inhibit is performed as part of the single program verify operation, as the inhibit voltage level would be stored in the original, or source latch. Once a first memory cell is successfully programmed, the data recovery latch can then be reused to buffer second data before being programmed to a second memory cell, thus not requiring an additional latch to buffer the data to be stored in at least the second memory cell of the set of memory cells.

In these embodiments, should control logic detect failure of the program verify operation for first data associated with a first memory cell of the set of memory cells, the control logic can perform a recovery operation. This recovery operation can include retrieving the first data from the data recovery latch and retrieving second data, which is associated with a second memory cell of the set of memory cells, from a source latch of the page buffer. Similarly, should the control logic, after detecting a pass of the program verify operation of the first memory cell, detect a failure of the program verify operation of the second memory cell, the control logic can perform a different recovery operation. This different recovery operation can include retrieving the first data from the first memory cell of the memory array (e.g., because now the first data safely resides in the memory array) and retrieving the second data from the data recovery latch. The principles and features of the disclosed programming operations and data recovery operations are extendable to a third memory cell, a fourth memory cell, and so forth, as applied to multi-page programming.

Advantages of this approach include, but are not limited to, improved performance and data security in the memory device. The ganged SLC verify operation described herein allows for the programming of multiple SLC pages to be concurrently (e.g., simultaneously) verified in a single verify operation. This results in fewer verify operations being performed (e.g., one half the number of verify operations when twice the amount of data is verified) for the same amount of data being programmed to the memory device. Accordingly, the latency associated with the entire programming operation is reduced, which can improve SLC programming performance. Further, in the small number of times that the ganged SLC verify operation fails, the present approach branches into a series of individual program verify operations on each respective memory cell of the set of memory cells. Before performing each of these individual program verify operations, the associated data of each memory cell can be backed up in the data recovery latch, ensuring data security while completing the multi-cell program operation. Additional advantages would be apparent to one skilled in the art in possession of the following disclosure.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device. Memory device 130, for example, can represent a single die or multiple dice having some control logic (e.g., local media controller 135) embodied thereon. In some embodiments, one or more components of the memory sub-system 110 are omitted.

In one embodiment, memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system.

In one embodiment, memory device 130 includes the local media controller 135 and a memory array 104, at least a portion of which is configured as SLC memory. As described herein, local media controller 135 can perform a program operation on the memory cells of memory array 104. A program operation can include, for example, a program phase and a program verify phase. During the program phase, a program voltage is applied to a selected wordline(s) of the memory array 104, in order to program a certain level(s) of charge to selected memory cells on the wordline(s) representative of a desired value(s). During the program verify phase, a read voltage is applied to the selected wordline(s) to read the level(s) of charge stored at the selected memory cells to confirm that the desired value (s) was properly programmed.

In at least one embodiment, local media controller 135, which is operatively coupled with the page buffer 152, can utilize a ganged single-level cell (SLC) verify operation to concurrently verify (e.g., at least partially overlapping in time) that memory cells in two separate sub-blocks of a block of memory array 104 were successfully programed with data from two separate pages using a single sensing operation. In one embodiment, the local media controller 135 can identify a set of memory cells in a block of memory array 104, where the set of memory cells includes two or more memory cells programmed during the program phase of the program operation and associated with a selected wordline of the memory array 104.

In at least one embodiment, the local media controller 135 further causes a program verify voltage to be applied to the selected wordline during the program verify phase of the program operation and perform a concurrent sensing operation on the set of memory cells to determine whether each memory cell in the set of memory cells was programmed to at least the program verify voltage during the program phase. Such a process can be repeated for multiple sets of memory cells in the block of memory array 104 and local media controller 135 can track (e.g., using a counter) a number of sets of memory cells that failed to be programmed to at least the program verify voltage. If the number of sets of memory cells that failed to be programmed satisfies a threshold criterion (e.g., is less than a threshold number), local media controller 135 can determine that the block has passed the program verify phase. If the number of sets of memory cells that failed to be programmed does not satisfy the threshold criterion (e.g., is greater than or equal to a threshold number), local media controller 135 can determine that the block has failed the program verify phase.

In some embodiments, the memory device 130 includes a page buffer 152 coupled to the memory array 104. The page buffer 152 can provide the circuitry used to program data to the memory cells of the memory device 130 and to read the data out of the memory cells. This circuitry includes, for example, a number of latches for buffering data, at least one of which is a data recovery latch, which will be discussed in more detail with reference to FIG. 5.

In these embodiments, in response to the set of memory cells failing to pass any given ganged SLC verify operation, the control logic of the local media controller 135 copies first data, which is associated with a first memory cell of the set of memory cells, into the data recovery latch, thus backing up the first data. The control logic further causes a program verify operation to be performed separately on the first memory cell, and, in response to the first memory cell reaching a program verify voltage, causing an inhibit of the first memory cell from further programming. The control logic can repeat this process on each respective memory cell of the set of memory cells until verification completion of programming to the set of memory cells. In this way, the control logic safely completes the multi-cell programming when the ganged SLC verify operation does not pass. In some embodiments, this control logic is integrated in whole or in part within the memory sub-system controller 115 and/or the host system 120. Further details with regards to the operations of local media controller 135 are described below.

Figure 1B:
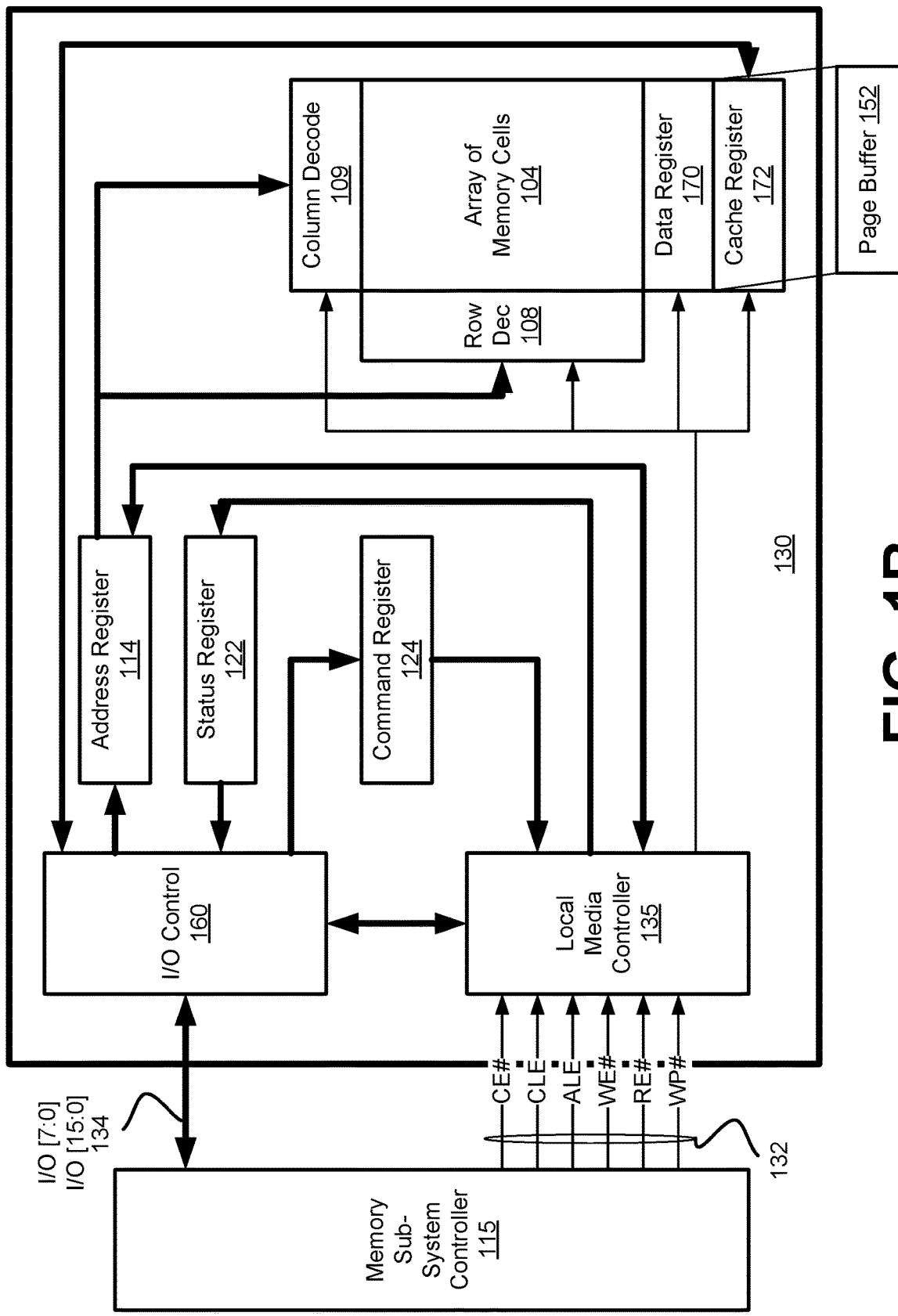
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses. In one embodiment, local media controller 135 can perform a ganged SLC verify operation to concurrently verify (i.e., at least partially overlapping in time) that memory cells in two separate sub-blocks of a block of memory array 104 were successfully programmed with data from two separate pages using a single sensing operation.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) the page buffer 152 of the memory device 130. The page buffer 152 may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
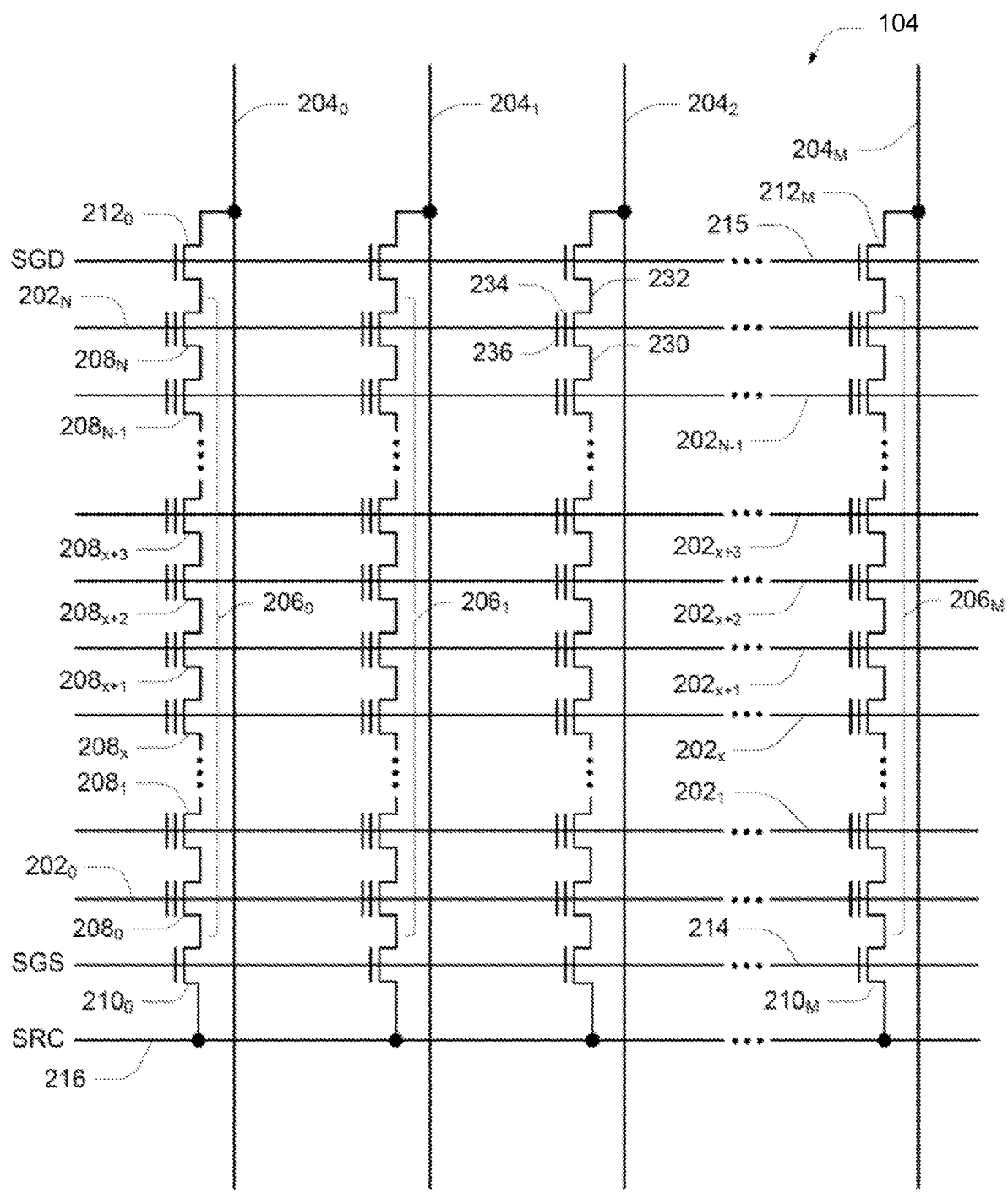
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bitlines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 104 in FIG. 2 can be a quasi-two-dimensional memory array and can have a generally planar structure, e.g., where the common source 216, NAND strings 206 and bitlines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2, it is apparent from the figure that the bitlines 204 of the array of memory cells 104 can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
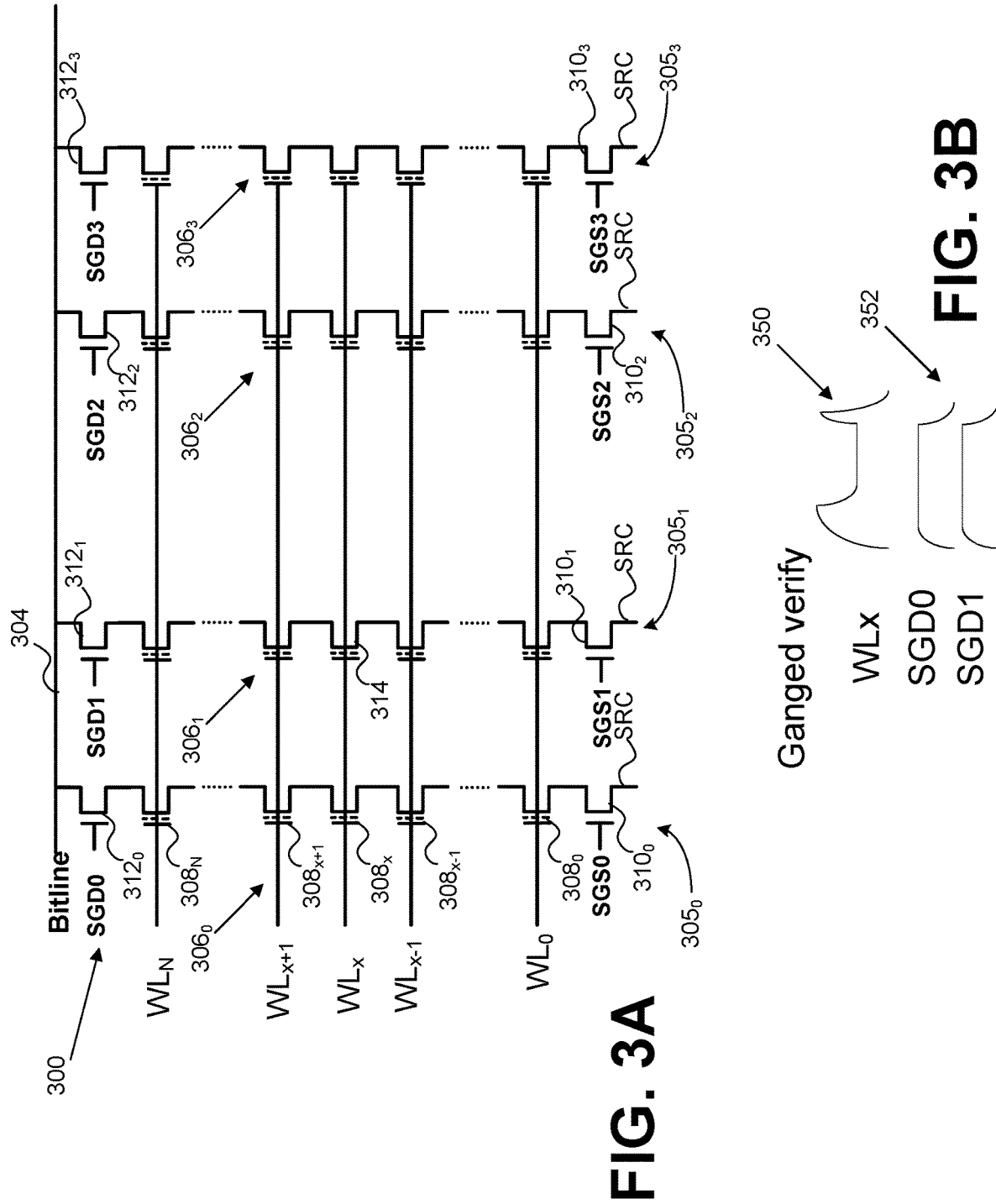
FIG. 3A is a schematic of portions of an array of memory cells implementing ganged single-level cell (SLC) verify in accordance with some embodiments of the present disclosure.
FIG. 3B is a signal diagram illustrating various signals applied to a memory array during a ganged SLC verify in accordance with some embodiments of the present disclosure.

FIG. 3A is a schematic of portions of an array of memory cells implementing ganged SLC verify in accordance with some embodiments of the present disclosure. The portion of the array of memory cells, such as memory array 104, can be a block 300, for example. In one embodiment, the block 300 includes strings of memory cells that can be grouped into sub-blocks, such as sub-blocks $305_0$-$305_3$. Other numbers of sub-blocks can be included in other embodiments.

Specifically, in at least some embodiments, the block 300 includes a bitline 304, where each sub-block is coupled to the bitline 304. The first sub-block $305_0$ can include a first drain select (SGD) transistor $312_0$, a first source select (SGS) transistor $310_0$, and a first string of memory cells $306_0$ coupled therebetween. The second sub-block $305_1$ can include a second SGD transistor $312_1$, a second SGS transistor $310_1$, and a second string of memory cells $306_1$ coupled therebetween. The third sub-block $305_2$ can include a third SGD transistor $312_2$, a third SGS transistor $310_2$, and a third string of memory cells $306_2$ coupled therebetween. The fourth sub-block $305_3$ can include a fourth SGD transistor $312_3$, a fourth SGS transistor $310_3$, and a fourth string of memory cells $306_3$ coupled therebetween. By way of example, the first string of memory cells $306_0$ includes multiple memory cells $308_0 \ldots 308_N$. Each SGS transistor can be connected to a common source (SRC), such as a source voltage line, to provide voltage to the sources of the multiple memory cells $308_0 \ldots 308_N$. In some embodiments, the source voltage line includes a source plate that supplies the source voltage. In at least some embodiments, multiple wordlines (WLs) are coupled with gates of memory cells of each string of memory cells $306_0 \ldots 306_3$.

In these embodiments, a first drain select gate line (SGD0) can be connected to the gate of the first SGD transistor $312_0$, a second drain select gate line (SGD1) can be connected to the gate of the second SGD transistor $312_1$, a third drain select gate line (SGD2) can be connected to the gate of the third SGD transistor $312_2$, and a fourth drain select gate line (SGD3) can be connected to the gate of the fourth SGD transistor $312_3$. Further, a first source select gate line (SGS0) can be connected to the gate of the first SGS transistor $310_0$, a second source select gate line (SGS1) can be connected to the gate of the second SGS transistor $310_1$, a third source select gate line (SGS2) can be connected to the gate of the third SGS transistor $310_2$, and a fourth source select gate line (SGS3) can be connected to the gate of the fourth SGS transistor $310_3$.

In on embodiment, local media controller 135 can perform a ganged SLC verify operation to concurrently verify (i.e., at least partially overlapping in time) that memory cells in two separate sub-blocks of block 300 were successfully programed with data from two separate pages using a single sensing operation. In one embodiment, the local media controller 135 can identify a set of memory cells in block 300, such as memory cells $308_x$ and 314 that were programmed during the program phase of a program operation. Memory cells $308_x$ and 314 are associated with a selected wordline WLx and are each associated with different sub-blocks and memory strings. For example, memory cell $308_x$ is part of memory string $306_0$ which forms sub-block $305_0$ and memory cell 314 is part of memory string $306_1$ which forms sub-block $305_1$. In one embodiment, the set of memory cells includes two memory cells, however, in other embodiments, the set of memory cells can include additional memory cells. In one embodiment, the memory cells in the set of memory cells are part of adjacent sub-blocks within block 300, however, in other embodiments, the memory cells in the set of memory cells can be non-adjacent.

In one embodiment, to perform the ganged SLC verify operation, the local media controller 135 causes a program verify voltage to be applied to the selected wordline, such as WLx, during the program verify phase of the program operation. The local media controller 135 can further perform concurrent sensing operations on the set of memory cells to determine whether each memory cell in the set of memory cells was programmed to at least the program verify voltage during the program phase. As illustrated in FIG. 3B, local media controller 135 can cause a single pulse having the program verify voltage level 350 to be applied to the selected wordline (WLx) and concurrently (e.g., simultaneously) activate respective select gate devices, such as first SGD transistor $312_0$ and second SGD transistor $312_1$. For example, signals 352 on the first drain select gate line (SGD0) and on the second drain select gate line (SGD1) can be driven high concurrently. During these concurrent sensing operations, local media controller 135 can determine whether a current from the shared bitline 304 flows through each respective memory string, such as memory strings $306_0$ and $306_1$, including the memory cells, such as memory cells $308_x$ and 314, in the set of memory cells. The current from the shared bitline 304 does not flow through the respective memory strings if the memory cells in the set of memory cells was programmed to at least the program verify voltage during the program phase of the program operation, which is indicative of the set of memory cells passing the program verify phase.

Such a process can be repeated for multiple sets of memory cells in the block 300 and local media controller 135 can track (e.g., using a counter) a number of sets that failed to be programmed to at least the program verify voltage. If the number of sets of memory cells that failed to be programmed satisfies a threshold criterion (e.g., is less than a threshold number), local media controller 135 can determine that the block 300 has passed the program verify phase. If the number of sets of memory cells that failed to be programmed does not satisfy the threshold criterion (e.g., is greater than or equal to a threshold number), local media controller 135 can determine that the block 300 has failed the program verify phase.

Figure 4:
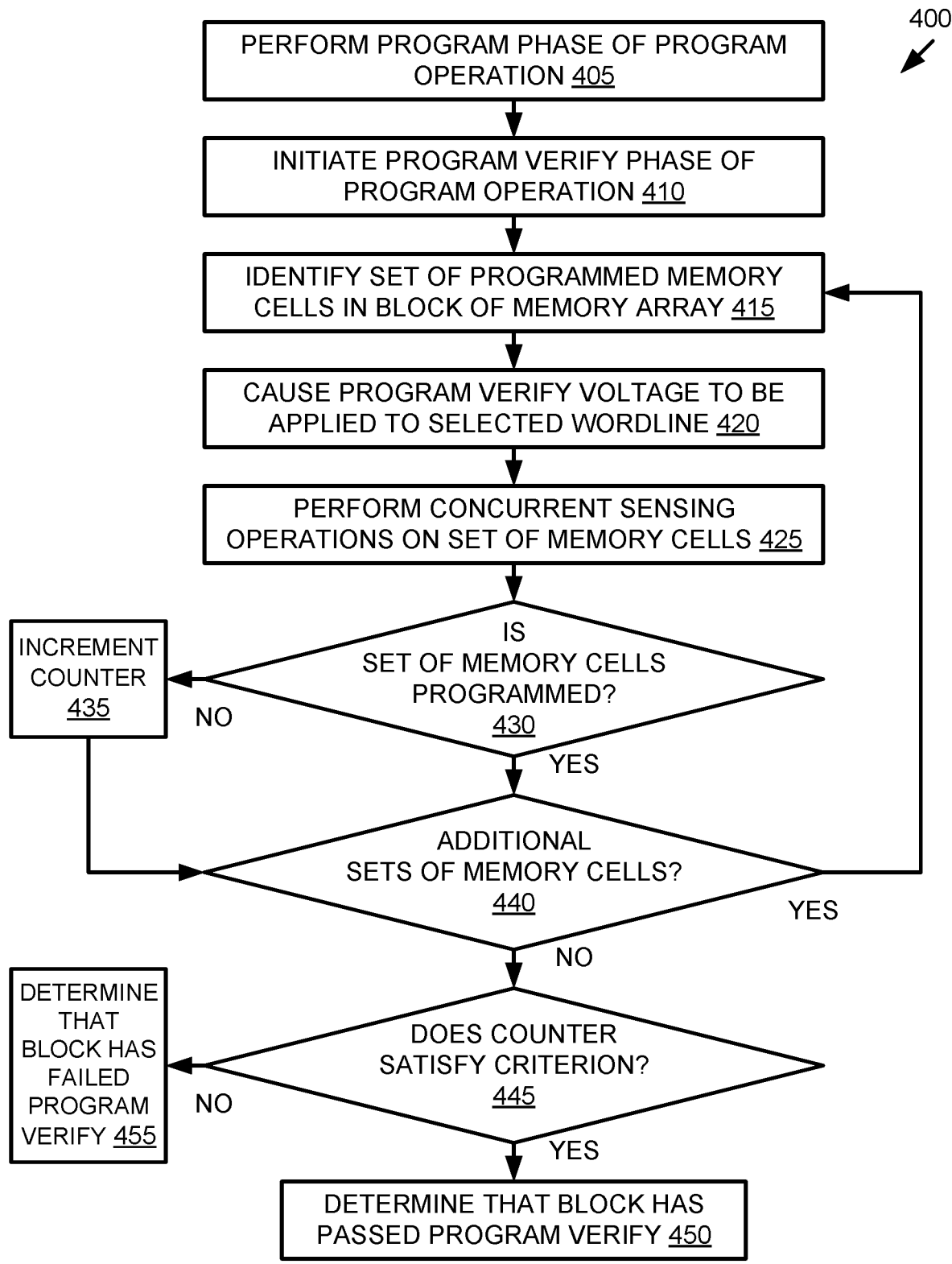
FIG. 4 is a flow diagram of an example method of ganged SLC verify in a memory device of a memory sub-system in accordance with some embodiments of the present disclosure.

FIG. 4 is a flow diagram of an example method 400 of ganged SLC verify in a memory device of a memory sub-system in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, memory cells are programmed. For example, processing logic (e.g., local media controller 135) can perform a program phase of a program operation to program two or more pages of data to a set of memory cells. In one embodiment, the processing logic can cause a double pulse having a program voltage level to be applied to a selected wordline of a block of a memory array, such as wordline $WL_x$ of block 300 of memory array 104 of memory device 130, as shown in FIG. 3A. Such a double pulse can program the set of memory cells, such as memory cells $308_x$ and 314, associated with the selected wordline with respective bits from two separate pages of data. In other embodiments, some other number of memory cells, or a different set of memory cells, can be programmed during the program phase.

At operation 410, the programmed memory cells are verified. For example, the processing logic can initiate a program verify phase of the program operation. In one embodiment, the program verify phase is initiated in response to completion of the program phase. As described in more detail below, during the program verify phase, a read voltage is applied to the selected wordline, such as $WL_x$, to read the level of charge stored at the selected memory cells to confirm that the desired value was properly programmed.

At operation 415, a set of memory cells is identified. For example, the processing logic can identify a set of memory cells in block 300, such as memory cells $308_x$ and 314 that were programmed during the program phase of the program operation. Memory cells $308_x$ and 314 are associated with a selected wordline WLx and are each associated with different sub-blocks and memory strings. For example, memory cell $308_x$ is part of memory string $306_0$ which forms sub-block $305_0$ and memory cell 314 is part of memory string $306_1$ which forms sub-block $305_1$. In one embodiment, all of the memory cells in the set of memory cells are memory cells that were programmed during the program phase (e.g., that are storing a certain level of charge representing a desired value, as opposed to those memory cells that were not programmed to any specific voltage level).

At operation 420, a voltage is applied to the memory array. For example, the processing logic can cause a program verify voltage to be applied to the selected wordline, such as $WL_x$, during the program verify phase of the program operation. In one embodiment, as illustrated in FIG. 3B, local media controller 135 can cause a single pulse having the program verify voltage level 350 to be applied to the selected wordline. In one embodiment, the program verify voltage level has a lower magnitude than the program voltage level.

At operation 425, sensing operations are performed. For example, the processing logic can perform concurrent sensing operations on the set of memory cells to determine whether each memory cell in the set of memory cells was programmed to at least the program verify voltage during the program phase of the program operation. In one embodiment, while the program verify voltage is applied to the selected wordline, local media controller 135 can concurrently (e.g., simultaneously) activate respective select gate devices, such as first SGD transistor $312_0$ and second SGD transistor $312_1$, corresponding to the memory cells in the identified set of memory cells. For example, signals 352 on the first drain select gate line (SGD0) and on the second drain select gate line (SGD1) can be driven high concurrently.

At operation 430, a determination is made. For example, the processing logic can determine whether the set of memory cells was programmed. During the concurrent sensing operations, local media controller 135 can determine whether a current from the shared bitline 304 flows through each respective memory string, such as memory strings $306_0$ and $306_1$. The current from the shared bitline 304 does not flow through the respective memory strings if the memory cells in the set of memory cells was programmed to at least the program verify voltage during the program phase of the program operation, which is indicative of the set of memory cells passing the program verify phase. Conversely, the current from the shared bitline 304 does flow through the respective memory strings if the memory cells in the set of memory cells was not programmed to at least the program verify voltage during the program phase of the program operation, which is indicative of the set of memory cells failing the program verify phase.

If the set of memory cells was not programmed, at operation 435, a counter is incremented. For example, the processing logic can maintain a counter, such as a count fail byte (CFBYTE) counter. In one embodiment, the counter is incremented in each instance where it is determined that all of the memory cells in a given set of memory cells was not adequately programmed (i.e., was not programmed to at least the program verify voltage). Thus, the value of the counter tracks a number of sets of memory cells that failed to be programmed to at least the program verify voltage.

Once it is either determined at operation 430 that the set of memory cells was programmed, or the counter is incremented at operation 435, processing can continue to operation 430. At operation 440, a determination is made. For example, the processing logic can determine whether there are additional sets of memory cells to be verified. As described above, a set of memory cells can include two or more memory cells of all the memory cells in a block that were programmed during the program phase of the program operation. In one embodiment, each of these memory cells is assigned to a set of memory cells which can be verified using ganged SLC verify, as described herein (e.g., at operations 420 and 425). In one embodiment, if there is a certain group of cells to verify, the group could be separated into sets, where a different ganged verify operation is performed on each set. For example, in an SLC case, if four sub-blocks are programmed together, all 4 sub-blocks could be ganged together for a single verify operation, or two separate ganged verify operations could be performed on two sub-blocks each. Other embodiments could utilize different verify levels, either for SLC memory or other memory types, such as TLC, QLC, etc. Accordingly, if there are additional sets of memory cells to be verified, processing can return to operation 415, and operations 415-435 can be repeated. If there are no additional sets of memory cells to be verified (i.e., if all memory cells have been verified), processing can continue to operation 445.

At operation 445, a determination is made. For example, the processing logic can determine whether the counter satisfies a threshold criterion. If the number of sets of memory cells that failed to be programmed satisfies the threshold criterion (e.g., is less than a threshold number), at operation 450, the processing logic can determine that the block 300 has passed the program verify phase. Subsequently, a new program operation can be initiated. If the number of sets of memory cells that failed to be programmed does not satisfy the threshold criterion (e.g., is greater than or equal to a threshold number), at operation 455, the processing logic can determine that the block 300 has failed the program verify phase. Subsequently, an additional program phase(s) and program verify phase(s) of the previous program operation can be performed to ensure that the memory cells are properly programmed to their target voltage levels.

Figure 5:
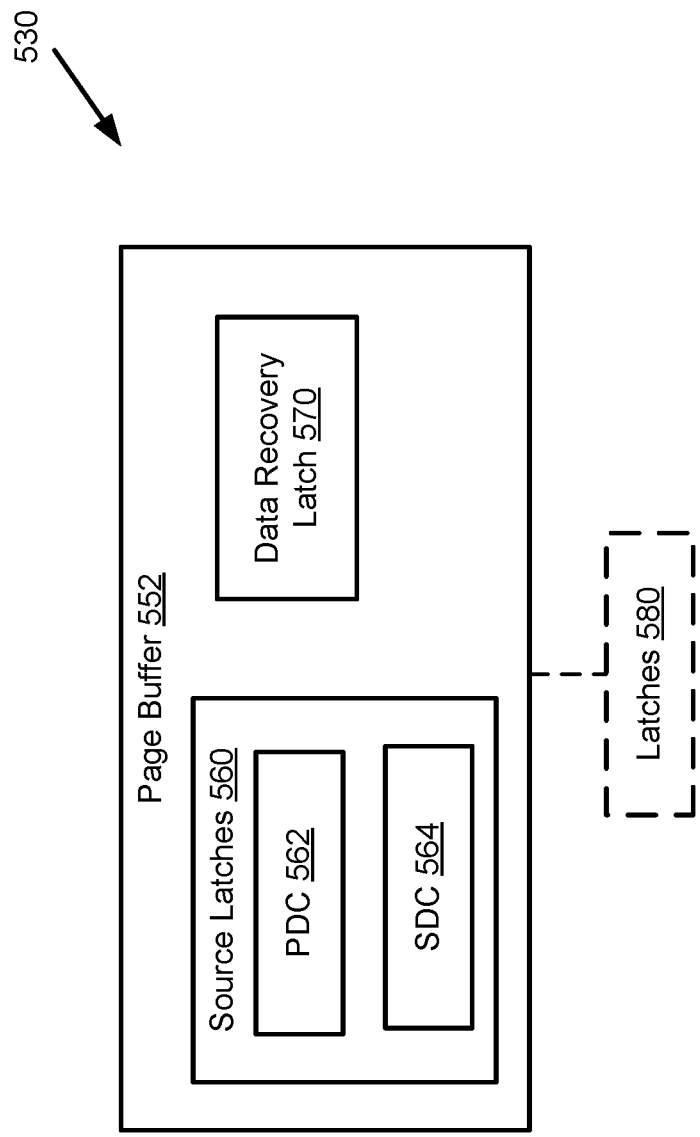
FIG. 5 is a simplified block diagram of a page buffer, as part of a memory device, in accordance with some embodiments.

FIG. 5 is a simplified block diagram of a page buffer 552, as part of a memory device 530, in accordance with some embodiments. In some embodiments, the memory device 530 is the memory device 130 and/or the page buffer 552 is the page buffer 152 of FIGS. 1A-1B. In at least some embodiments, the page buffer 552 includes a number of source latches 560, such as are located in primary data cache (PDC) 562 and/or secondary data cache (SDC) 564. In these embodiments, the page buffer 552 includes additional latches, such as a data recovery latch 570. In one embodiment, the data recovery latch 570 is a single static latch such as within the PDC 562 or the SDC 564. In another embodiment, the data recovery latch 570 is a single dynamic latch that can more fluidly, in real time, be updated within the circuitry of the page buffer 552. In some embodiments, such a dynamic latch is located at a node within multiple transistor switches, where the node is capacitively charged or discharged via one or more transistors of the multiple transistor switches.

In some embodiments, the memory device 530 includes one more latches 580 located near but outside of the page buffer 552. In these embodiments, a latch of the one or more latches 580 can be employed as the data recovery latch 570, even though more latency might be involved with accessing the one or more latches 580.

Because the number of latches required generally expands the on-chip size of the page buffer 552, and latches are employed for many purposes, the present disclosure endeavors to limit the use of latches in conjunction with data recovery. For example, in certain memory devices if two pages of data (e.g., to be programmed to two memory cells coupled with the same wordline) are stored in a first pair of latches of the source latches 560, then a second pair of latches are additionally employed to store a backup of each page of data. This backup in the second pair of latches is necessary in a page buffer that destroys or removes a page of data in a source latch to replace that page of data with an inhibit voltage level, which is employed to perform a program verify during the above discussed program verify phase. Because the original data is lost from that source latch, the second pair of latches can store a backup of that data if it needs to be recovered in the case of a failure of the ganged SLC verify operation, which was discussed previously.

To further limit the reliance on extra latches (which requires more power and on-die area), the present disclosure employs the single data recovery latch 570 for backing up pages of data that are being serially programmed and verified in completion of a multi-cell program operation, as will be discussed with reference to FIGS. 6-7. As will also be discussed, this data recovery latch 570 can facilitate data recovery in instances in response to the ganged SLC verify operation failing to pass.

Figure 6:
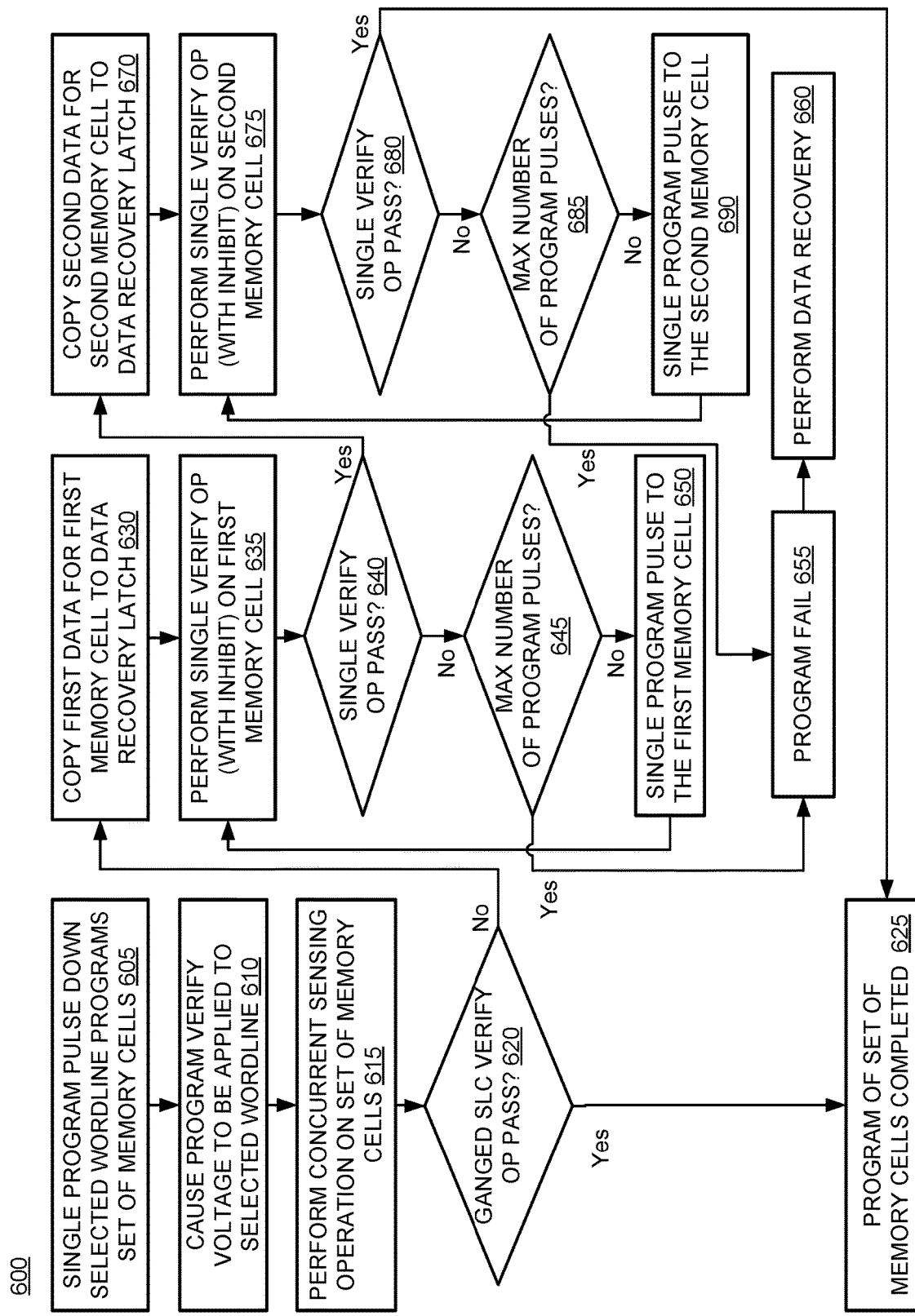
FIG. 6 is a flow diagram of an example method of a SLC program-verify, latch-limited data recovery operation in accordance with at least some embodiments.

FIG. 6 is a flow diagram of an example method 600 of a SLC program-verify, latch-limited data recovery operation in accordance with at least some embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, a set of memory cells is programmed. More specifically, the processing logic causes a single program pulse to program a set of memory cells of the memory array 104. In these embodiments, the set of memory cells includes two or more memory cells programmed during a program phase and associated with a selected wordline.

At operation 610, a program verify voltage is applied. More specifically, the processing logic causes the program verify voltage to be applied to the selected wordline. In some embodiments, the processing logic causes a single pulse having a program verify voltage to be applied to the selected wordline of the memory array 104 during a ganged SLC verify operation to concurrently verify that the set of memory cells were programmed to at least the program verify voltage during the program phase. See also operation 420 of FIG. 4.

At operation 615, concurrent sensing is performed. More specifically, the processing logic performs a concurrent sensing operation on the set of memory cells to determine whether each memory cell of the set of memory cells was programmed to at least the program verify voltage during the program phase. See also operation 425 of FIG. 4. IN at least some embodiments, the ganged SLC verify operation of operations 610 and 615 excludes inhibiting the set of memory cells. Accordingly, first data associated with a first memory cell and second data associated with a second memory cell are still buffered in source latches and have not been replaced with an inhibit voltage level.

At operation 620, a check of the ganged SLC verify operation is performed. More specifically, the processing logic determines whether the ganged SLC verify operation performed in operations 610 and 615 has passed, e.g., the set of memory cells have been programmed to at least the program verify voltage. See also operation 430 of FIG. 4.

If, at operation 620, the ganged SLC verify operation has passed, at operation 625, the processing logic detects that programing the set of memory cells has completed. Many of the multi-cell programming operations directed by the processing logic will end in this way due to efficient program (e.g., using a single pulse) and program verify (e.g., using a single pulse) in many cases.

If, however, at operation 620, the ganged SLC verify operation does not pass, the method 600 transitions to serially, for data associated with each respective memory cell of the set of memory cells, performing a program verify operation in order to successfully complete multi-cell programming. For example, a first program verify operation can be performed in a first loop of operations 635 through 650 and a second program verify operation can be performed in a second loop of operations 675 through 690, which are described in detail below.

In various embodiments, these loops generally include iteratively performing: copying the data, which is being programmed to a respective memory cell of the set of memory cells, from a source latch into the data recovery latch; causing a program verify operation to be performed separately on the respective memory cell; and, in response to the respective memory cell reaching a program verify voltage, causing an inhibit of the respective memory cell from further programming. In this way, once the program verify operation has passed for any given memory cell, that memory cell is inhibited from further programming despite that fact that the wordline may still be asserted for programming another memory cell coupled with the same wordline.

At operation 630, first data is backed up. More specifically, the processing logic copies first data associated with a first memory cell form a source latch to the data recovery latch 570. The first memory cell can be a first of the set of memory cells.

At operation 635, a single verify operation is performed. More specifically, the processing logic causes a program verify operation to be performed separately on the first memory cell. For example, in response to the first memory cell reaching a program verify voltage, the processing logic causes an inhibit of the first memory cell from further programming. As discussed, this causes the purge or removal of the first data from the source latch.

At operation 640, a check of the program verify operation is performed. More specifically, the processing logic determines whether the program verify operation has passed or failed. If the program verify operation has failed, at operation 645, the processing logic determines whether the program operation of the first memory cell has reached a maximum number of program pulses. The maximum number of program pulses is a check to protect the memory device and ensure the memory cells are not over-programmed, and can be tracked with a counter for example. If, at operation 645, the maximum number of program pulses has not been reached, at operation 650, the processing logic causes another program pulse be applied to the selected wordline to further program the first memory cell. If, however, at operation 645, the maximum number of program pulses has been reached, at operation 655, the processing logic detects a program fail of the first memory cell.

If, at operation 650, another (or a subsequent) program pulse has been applied to the selected wordline to further program the first memory cell, the method 600 loops back to operation 635 and repeats operations 635 through 650 until, at operation 640, the processing logic detects a successful pass of the program verify operation or, at operation 655, the processing logic detects a program failure. Assuming that, at operation 640, the program verify operation has passed, the method serially transitions to a program verify operation of the second memory cell.

Further, in some embodiments, in response to detecting a pass of the program verify operation on the first memory cell, the processing logic copies the first data in the data recovery latch back 570 into a source latch of the page buffer 552, e.g., the source latch from which the first data was originally backed up. This further step can be optionally performed in order to facilitate data recovery of the first data should the overall ganged SLC verify operation fail, which will be discussed in more detail with reference to operation 660.

At operation 670, second data is backed up. More specifically, the processing logic copies second data associated with a second memory cell from a source latch to the data recovery latch 570. The second memory cell can be a second of the set of memory cells.

At operation 675, a single verify operation is performed. More specifically, the processing logic causes a program verify operation to be performed separately on the second memory cell. For example, in response to the second memory cell reaching a program verify voltage, the processing logic causes an inhibit of the second memory cell from further programming. As discussed, this causes the purge or removal of the first data from the source latch.

At operation 680, a check of the program verify operation is performed. More specifically, the processing logic determines whether the program verify operation has passed or failed. If the program verify operation has failed, at operation 685, the processing logic determines whether the program operation of the second memory cell has reached a maximum number of program pulses. The maximum number of program pulses is a check to protect the memory device and ensure the memory cells are not over-programmed, and can be tracked with a counter for example. If, at operation 685, the maximum number of program pulses has not been reached, at operation 690, the processing logic causes another program pulse be applied to the selected wordline to further program the second memory cell. If, however, at operation 645, the maximum number of program pulses has been reached, at operation 655, the processing logic detects a program fail of the second memory cell.

If, at operation 690, another program pulse has been applied to the selected wordline to further program the first second cell, the method 600 loops back to operation 675 and repeats operations 675 through 690 until, at operation 680, the processing logic detects a successful pass of the program verify operation or, at operation 655, the processing logic detects a program failure. Assuming that, at operation 680, the program verify operation of the second memory cell has passed, the method one of serially transitions to a program verify operation of a third memory cell (e.g., where the program verify operation loop can again be applied to further memory cells of the set of memory cells) or transitions to operation 625.

Further, in some embodiments, in response to detecting a pass of the program verify operation on the second memory cell, the processing logic copies the second data in the data recovery latch 570 back into a source latch of the page buffer 552, e.g., the source latch from which the second data was originally backed up. This further step can be optionally performed in order to facilitate data recovery of the second data should the overall ganged SLC verify operation fail, which will be discussed in more detail with reference to operation 660.

As discussed, at operation 625, the processing logic detects that programing the set of memory cells has completed and the method exits. If viewed as a subset of the method 400 of FIG. 4, the method 600 of FIG. 6 can be repeated for each set of multiple sets of memory cells until determining whether a block (of which each set of memory cells is a part) has passed the program verify.

At operation 660, if either program verify operation loop of either the first memory cell (operations 630 through 650) or the second memory cell (operations 670 through 690) ends at operation 655 in a program failure, then the processing logic will perform a data recovery operation. For example, in response to detecting a failure of the program verify operation on the first memory cell, the processing logic can perform a data recovery operation, which includes retrieving the first data from the data recovery latch and retrieving second data from a source latch of the page buffer. Otherwise, in response to detecting a pass of the program verify operation of the first memory cell and a failure of the program verify operation of the second memory cell, the processing logic can perform a recovery operation, which includes retrieving the first data from the first memory cell of the memory array and retrieving the second data from the data recovery latch. In either of these instances, instead of retrieving the data from the data recovery latch, the data can be retrieved from a source latch if the data was copied back to the source latch, as was previously discussed as an option to facilitating data recovery. Also, data retrieved from a source latch that is not otherwise being used at this point in the program operation can be retrieved more quickly than trying to retrieve the same data from the memory array 104 during data recovery.

Figure 7:
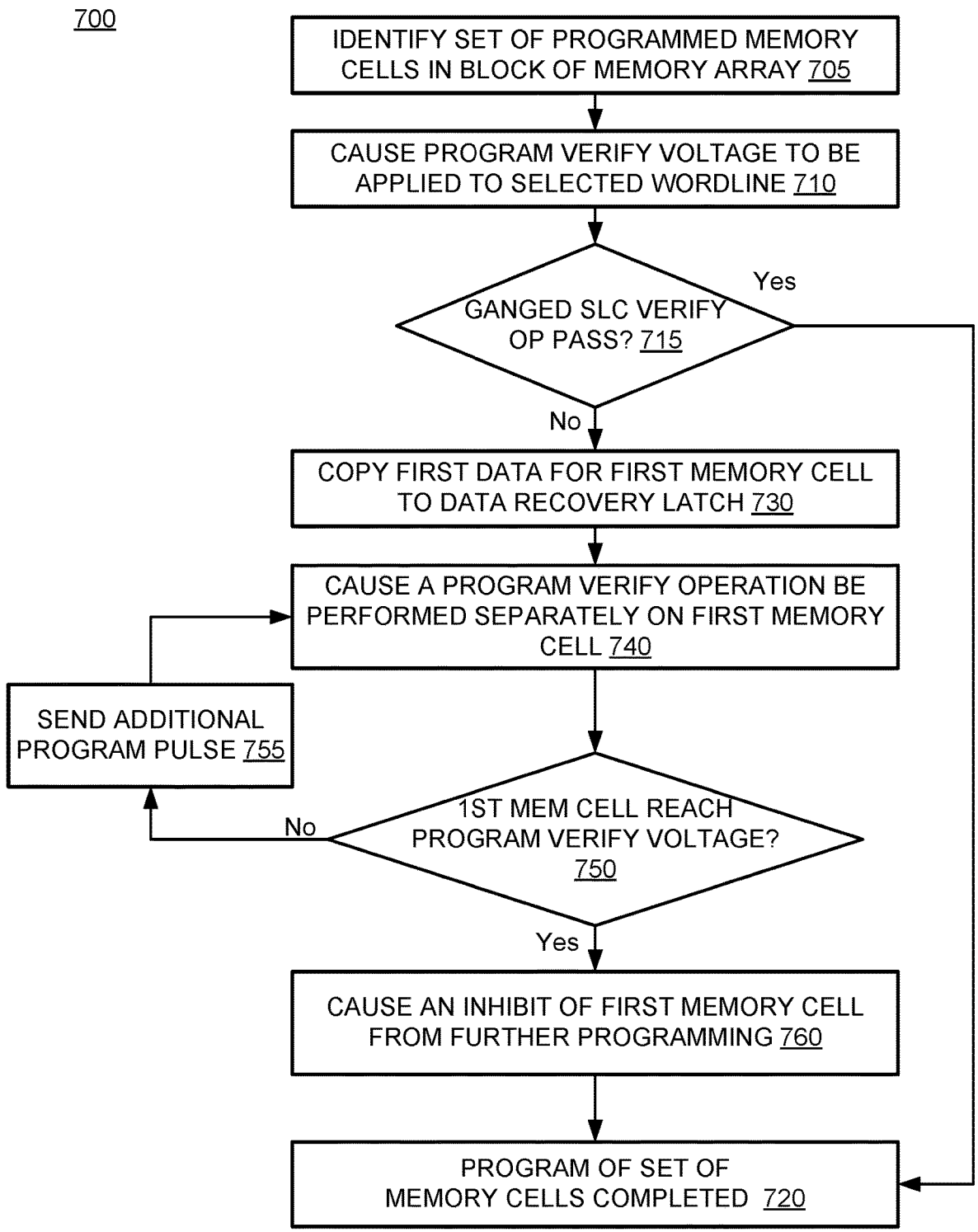
FIG. 7 is a flow diagram of an example method of a SLC program-verify, latch-limited operation in accordance with at least one embodiment.

FIG. 7 is a flow diagram of an example method 700 of a SLC program-verify, latch-limited operation in accordance with at least one embodiment. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 705, a set of memory cells is identified. For example, the processing logic can identify a set of memory cells of the memory array 104 configured as single-level cell (SLC) memory. The set of memory cells can include two or more memory cells programmed during the program phase and be associated with a selected wordline. For example, the set of memory cells can include the memory cells $308_x$ and 314 that were programmed during the program phase of the program operation (FIG. 3A). Memory cells $308_x$ and 314 are associated with a selected wordline WLx and are each associated with different sub-blocks and memory strings. For example, memory cell $308_x$ is part of memory string $306_0$ which forms sub-block $305_0$ and memory cell 314 is part of memory string $306_1$ which forms sub-block $305_1$. In one embodiment, all of the memory cells in the set of memory cells are memory cells that were programmed during the program phase (e.g., that are storing a certain level of charge representing a desired value, as opposed to those memory cells that were not programmed to any specific voltage level).

At operation 710, a voltage is applied to the memory array. For example, the processing logic can cause a program verify voltage to be applied to the selected wordline, such as $WL_x$, during a ganged SLC verify operation to be performed concurrently on the set of memory cells. This may be one of many ganged SLC verify operations performed on a set of memory cells during the program verify phase of the program operation. In one embodiment, as illustrated in FIG. 3B, local media controller 135 can cause a single pulse having the program verify voltage level 350 to be applied to the selected wordline. In one embodiment, the program verify voltage level has a lower magnitude than the program voltage level.

At operation 715, a check is performed on the ganged SLC verify operation. For example, the processing logic can determine whether the ganged SLC verify operation has passed or failed. If, at operation 715, the processing logic detects the ganged SLC verify operation has passed, at operation 720, the processing logic detects that the program of the set of memory cells has successfully completed and can exit.

If, however, at operation 715, in response to the set of memory cells failing to pass the ganged SLC verify operation, at operation 730, first data is backed up. More specifically, the processing logic copies first data, which is associated with a first memory cell of the set of memory cells, into a data recovery latch of a page buffer coupled with the memory array.

At operation 740, a program verify operation is performed. More specifically, the processing logic causes a program verify operation to be performed separately on the first memory cell. The program verify operation can include applying a program verify voltage to the selected wordline and sensing whether the first memory cell has reached the program verify voltage, as has been discussed in more detail previously.

At operation 750, a pass/fail check is performed. More specifically, the processing logic determines whether a voltage of the first memory cell has reached the program verify voltage. If, at operation 750, the first memory cell has not reached the program verify voltage, the processing logic can cause an additional program pulse down the selected wordline to cause the first memory cell to be further programmed. The method 700 can then loop back through operations 740 and 750 (which can be modified to be aligned with operations 635 through 650 of FIG. 6) until the first memory cell passes the verify operation at operation 750.

At operation 760, a program inhibit is applied. More specifically, in response to the first memory cell reaching the program verify voltage, the processing logic causes an inhibit of the first memory cell from further programming. Performing this inhibit can ensure that the fully programmed first memory cell is not further programmed while the selected wordline is further asserted in programming one or more additional memory cell of the set of memory cells.

In various embodiments, operations 730 through 760 can be repeated for an additional memory cell of the set of memory cells until all of the set of memory cells have been successfully programmed and verified. Once all of the memory cells of the set of memory cells have been verified as fully programmed, at operation 720, the processing logic the processing logic detects that the program of the set of memory cells has successfully completed and can exit.

Figure 8:
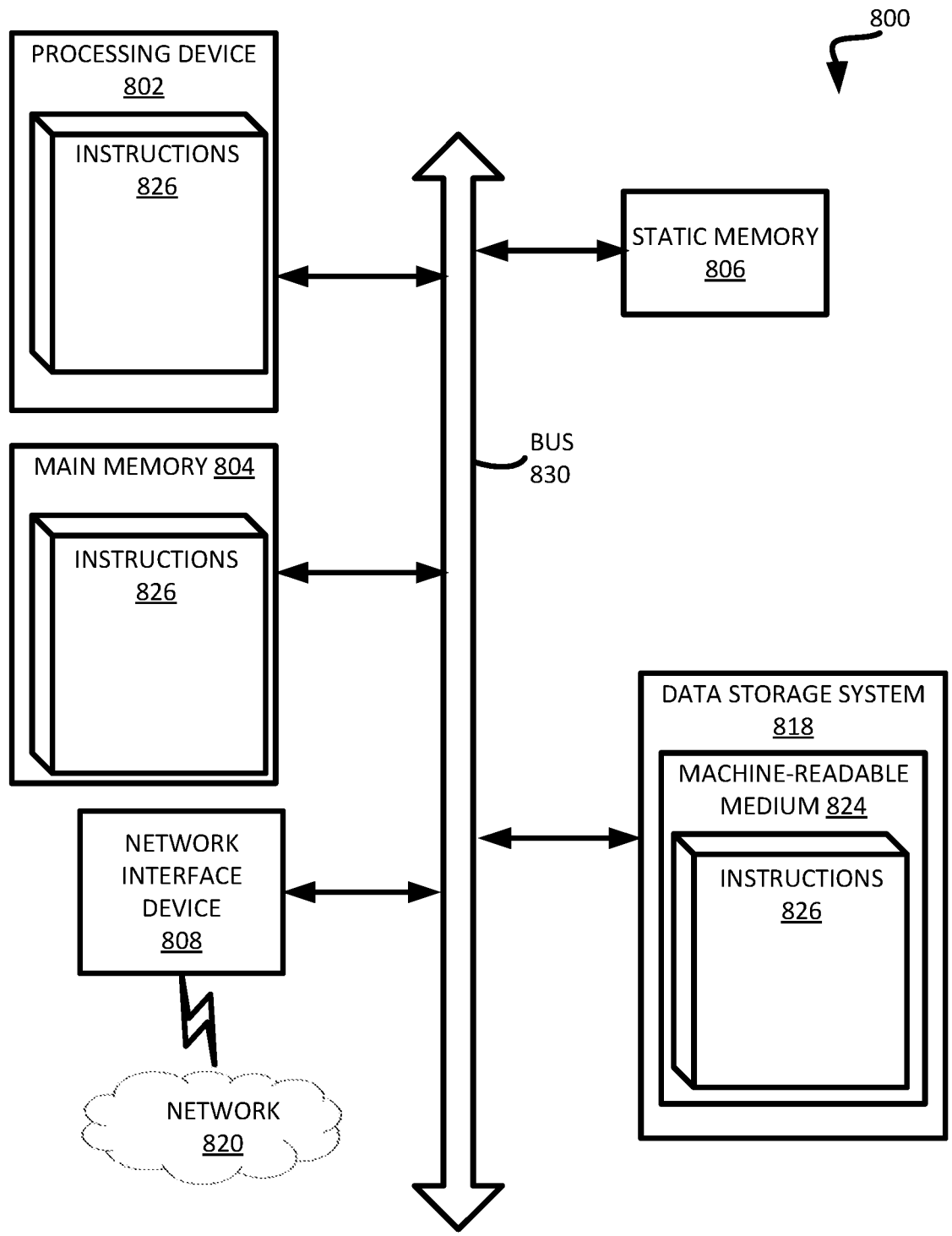
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the local media controller 135 of FIGS. 1A-1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1A.

In one embodiment, the instructions 826 include instructions to implement functionality corresponding to the local media controller 135 of FIGS. 1A-1B). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array configured as single-level cell (SLC) memory;
   a page buffer that includes a data recovery latch, the page buffer coupled with the memory array; and
   control logic, operatively coupled with the page buffer, to perform operations comprising:
      identifying a set of memory cells of the memory array, wherein the set of memory cells comprises two or more memory cells programmed during a program phase and associated with a selected wordline of the memory array;
      causing a program verify voltage to be applied to the selected wordline during a ganged SLC verify operation to be performed concurrently on the set of memory cells; and
      in response to the set of memory cells failing to pass the ganged SLC verify operation:
         copying first data, which is associated with a first memory cell of the set of memory cells, into the data recovery latch;
         causing a program verify operation to be performed separately on the first memory cell; and
         in response to detecting a pass of the program verify operation on the first memory cell, copying the first data in the data recovery latch back into a source latch of the page buffer.

2. The memory device of claim 1, wherein, in response to detecting a failure of the program verify operation on the first memory cell, the control logic is to perform operations further comprising performing a data recovery operation, which comprises:
   retrieving the first data from the data recovery latch; and
   retrieving second data, which is associated with a second memory cell of the set of memory cells, from a source latch of the page buffer.

3. The memory device of claim 1, wherein, in response to the first memory cell reaching a program verify voltage, causing an inhibit of the first memory cell from further programming.

4. The memory device of claim 1, wherein, in response to completion of the program verify operation performed on the first memory cell, the control logic is to perform operations further comprising:
copying second data, which is associated with a second memory cell of the set of memory cells, into the data recovery latch; and
causing a program verify operation to be performed separately on the second memory cell.

5. The memory device of claim 4, wherein, in response to detecting a pass of the program verify operation of the first memory cell and a failure of the program verify operation of the second memory cell, the control logic is to perform operations comprising performing a recovery operation, which comprises:
retrieving the first data from the first memory cell of the memory array; and
retrieving the second data from the data recovery latch.

6. The memory device of claim 1, wherein the ganged SLC verify operation excludes inhibiting the set of memory cells, and wherein causing the program verify operation to be performed comprises the control logic iteratively performing the operations of:
determining whether the first memory cell has passed the program verify operation;
inhibiting the first memory cell in response to detecting that the first memory cell has passed the program verify operation; and
in response to detecting the first memory cell has not passed the program verify operation, causing a subsequent program pulse to be applied to the selected wordline to further program the first memory cell.

7. The memory device of claim 1, wherein the data recovery latch is one of a single dynamic latch or a single static latch.

8. The memory device of claim 1, wherein two or more memory cells in the set of memory cells are each associated with an adjacent sub-block of a block of the memory array.

9. The memory device of claim 1, wherein the control logic is to perform operations further comprising:
performing the program phase to program two or more pages of data in the set of memory cells; and
initiating the ganged SLC verify operation in response to completion of the program phase, wherein the ganged SLC verify operation includes performing a concurrent sensing operation on the set of memory cells to determine whether each memory cell of the set of memory cells was programmed to at least the program verify voltage during the program phase.

10. A method comprising:
identifying a set of memory cells of a memory array configured as single-level cell (SLC) memory, wherein the set of memory cells comprises two or more memory cells programmed during a program phase and associated with a selected wordline of the memory array;
causing a program verify voltage to be applied to the selected wordline during a ganged SLC verify operation to be performed concurrently on the set of memory cells; and
in response to the set of memory cells failing to pass the ganged SLC verify operation:
copying first data, which is associated with a first memory cell of the set of memory cells, into a data recovery latch of a page buffer coupled with the memory array;
causing a program verify operation to be performed separately on the first memory cell; and
in response to detecting a pass of the program verify operation on the first memory cell, copying the first data in the data recovery latch back into a source latch of the page buffer.

11. The method of claim 10, further comprising, in response to detecting a failure of the program verify operation on the first memory cell, performing a recovery operation, which comprises:
retrieving the first data from the data recovery latch; and
retrieving second data, which is associated with a second memory cell of the set of memory cells, from a source latch of the page buffer.

12. The method of claim 10, further comprising, in response to the first memory cell reaching a program verify voltage, causing an inhibit of the first memory cell from further programming.

13. The method of claim 10, further comprising, in response to completion of the program verify operation performed on the first memory cell:
copying second data, which is associated with a second memory cell of the set of memory cells, into the data recovery latch; and
causing a program verify operation to be performed separately on the second memory cell.

14. The method of claim 13, further comprising, in response to detecting a pass of the program verify operation of the first memory cell and a failure of the program verify operation of the second memory cell:
retrieving the first data from the first memory cell of the memory array; and
retrieving the second data from the data recovery latch.

15. The method of claim 10, wherein the ganged SLC verify operation excludes inhibiting the set of memory cells, and wherein causing the program verify operation to be performed comprises iteratively:
determining whether the first memory cell has passed the program verify operation;
causing an inhibit of the first memory cell in response to detecting that the first memory cell has passed the program verify operation; and
in response to detecting the first memory cell has not passed the program verify operation, causing a subsequent program pulse to be applied to the selected wordline to further program the first memory cell.

16. The method of claim 10, further comprising:
performing the program phase to program two or more pages of data in the set of memory cells; and
initiating the ganged SLC verify operation in response to completion of the program phase, wherein the ganged SLC verify operation includes performing a concurrent sensing operation on the set of memory cells to determine whether each memory cell of the set of memory cells was programmed to at least the program verify voltage during the program phase.

17. A memory device comprising:
a memory array configured as single-level cell (SLC) memory;
a page buffer that includes a data recovery latch, the page buffer coupled with the memory array; and
control logic, operatively coupled with the page buffer, to perform operations comprising:

causing a single program pulse to program a set of memory cells of the memory array, wherein the set of memory cells comprises two or more memory cells programmed during a program phase and associated with a selected wordline;

causing a single pulse having a program verify voltage to be applied to the selected wordline of the memory array during a ganged SLC verify operation to concurrently verify that the set of memory cells were programmed to at least the program verify voltage during the program phase; and in response to the set of memory cells failing to pass the ganged SLC verify operation, serially, for data associated with each respective memory cell of the set of memory cells:

copying the data, which is being programmed to a respective memory cell of the set of memory cells, from a source latch into the data recovery latch;

causing a program verify operation to be performed separately on the respective memory cell; and in response to detecting a pass of the program verify operation on a first memory cell of the set of memory cells, copying first data for the first memory cell in the data recovery latch back into the source latch of the page buffer.

18. The memory device of claim 17, wherein, in response to detecting a failure of the program verify operation on the first memory cell of the set of memory cells, the control logic is to perform operations further comprising performing a data recovery operation, which comprises:

retrieving the first data from the data recovery latch; and retrieving second data, which is associated with a second memory cell of the set of memory cells, from the source latch of the page buffer.

19. The memory device of claim 17, wherein, in response to the respective memory cell reaching a program verify voltage, causing an inhibit of the respective memory cell from further programming.

20. The memory device of claim 17, wherein, in response to detecting a pass of the program verify operation of a first memory cell and a failure of the program verify operation of a second memory cell, the control logic is to perform operations further comprising performing a recovery operation, which comprises:

retrieving the first data from the first memory cell of the memory array; and retrieving second data associated with the second memory cell from the data recovery latch.

\* \* \* \* \*